United States Patent
Evans

(10) Patent No.: US 8,081,024 B1
(45) Date of Patent: Dec. 20, 2011

(54) CMOS PHASE INTERPOLATION SYSTEM

(75) Inventor: William Pierce Evans, Catonsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 69 days.

(21) Appl. No.: 12/640,461

(22) Filed: Dec. 17, 2009

(51) Int. Cl.
*H03H 11/16* (2006.01)

(52) U.S. Cl. ........................................ 327/231; 327/175
(58) Field of Classification Search .................. None
See application file for complete search history.

(56) References Cited

U.S. PATENT DOCUMENTS 6,384,653 B1  5/2002  Broome
7,038,520 B2 *  5/2006  Chiba et al. ................... 327/333
7,206,370 B2 *  4/2007  Nakao ........................... 375/376
7,466,179 B2 * 12/2008  Huang et al. ................... 327/258

* cited by examiner

*Primary Examiner* — Cassandra Cox
(74) *Attorney, Agent, or Firm* — Rosenberg, Klein & Lee

(57) ABSTRACT

A CMOS phase interpolation system comprises a capacitive integration unit coupled to a charge node and a plurality of selectively enabled current source units operably coupled to the charge node. The current source units each include: a charging segment; a discharging segment; and, a switching segment operable responsive to at least one periodic reference signal to selectively couple the charging and discharging segments to the charge node for alternatively charging and discharging the capacitive integration unit therethrough. The current source units are selectively enabled in predetermined combinations to uniquely define an output waveform at the charge node. An output conditioning unit coupled to the charge node generates a recovered periodic signal based on the output waveform. In certain applications, a duty cycle correction unit coupled to feed back from the output node adaptively biases a charging segment current of each enabled current source unit, responsive to the recovered periodic signal.

30 Claims, 8 Drawing Sheets

CMOS PHASE INTERPOLATION SYSTEM

BACKGROUND OF THE INVENTION

The subject CMOS phase interpolation system is generally directed to a system for incorporating a predetermined phase shift into a periodic signal. More specifically, the subject CMOS phase interpolation system generates from one or more reference clock signals a suitably phase shifted clock signal whose duty cycle is adaptively corrected to remain substantially at a desired level.

Phase interpolator circuits find use in a wide variety of applications where fine phase adjustments are necessary in the generation of timing signals, such as digital clock signals. Phase interpolator circuits are employed in the clock data recovery (CDR) carried out, for example, in Serializer-DeSerializer (SerDes) systems to smoothly shift the phase of a recovered clock signal to a selected point within a full 360° range of phase rotation. Typically, the phase of the recovered clock signal in these applications is set to an interpolated value falling at or between phase-separated versions of a given clock signal which serve in the first instance as the reference signals. The operational flexibility afforded by such phase interpolator circuits even allows for the generation of a recovered clock signal that is effectively offset in frequency from a reference clock by continuously rotating its phase through multiple cycles.

Generally, two types of phase interpolator architecture are typically employed: current mode logic (CML) and complimentary metal oxide semiconductor (CMOS) logic. In phase interpolator circuits of the CML type, in-phase and quadrature clocks, along with their complements, are used as the reference clocks. These clocks are applied to switch on and off differential pairs of transistors coupled to weighted current sources. Four differential pairs are used typically to generate an output phase value interpolated between any adjacent two of four reference phases corresponding to the differential pairs, namely, 0°, 90°, 180°, and 270°.

A significant drawback of the CML approach is that they tend to require generally higher supply voltages than may be available in certain applications. Another drawback is that a CML phase interpolator effects smaller signal swing than those using CMOS logic. Consequently, in order to preserve compatibility with CMOS logic employed in other surrounding circuitry or other downstream circuitry, translation of a CML phase interpolator's signal swing to CMOS-compatible levels is normally required. This translation often becomes an unwanted source of jitter and duty cycle distortion in the phase interpolated signal.

CMOS phase interpolators heretofore known also suffer from significant drawbacks. First, the maximum frequency realizable in the phase interpolated clock signal is limited by the excessive number of gates that the given timing signal must propagate through to maintain proper control over such factors as reset time and state transitions. With the gate densities attained using 90 nm CMOS process technology, for example, CMOS-type phase interpolators heretofore known encounter difficulty generating clocks ranging in frequency beyond about 1 GHz. Even that range exceeds the reach of CMOS interpolators implemented at smaller scale CMOS process technologies, such as at 65 nm and 40 nm scale.

Another drawback of the CMOS type phase interpolators heretofore known is their requirement for dual phase interpolator circuits to maintain a clock having somewhere near 50% duty cycle. Aside from the undue complexity added by the additional circuitry, known techniques fail to maintain effective control over the clock's duty cycle. Consequently, an extraneous duty cycle correction circuit is additionally required for typical CDR applications using dual phase interpolator circuitry. There is, therefore, a need for a phase interpolator system that is implemented in CMOS to preserve the power efficiencies and other general advantages of CMOS logic, but which overcomes the practical drawbacks of such implementation. There is a need for a CMOS phase interpolator system which minimizes the number of gates required in the signal path to generate clock signals of higher frequency than in comparable systems heretofore known. There is a need for such CMOS phase interpolator systems equipped with suitable measures to simply and accurately maintain the generated clock signal substantially at a desired duty cycle.

SUMMARY OF THE INVENTION

It is an object of the present invention to provide a phase interpolator system implemented using CMOS logic circuitry to generate a periodic signal accurately maintaining a desired phase shift and duty cycle.

It is another object of the present invention to provide a CMOS phase interpolator system which simply and accurately provides a periodic signal phase shifted by the desired amount, which minimizes the number of required logic gates in its signal path.

It is yet another object of the present invention to provide a CMOS phase interpolator system having correction circuitry to adaptively maintain the duty cycle of the periodic signal it generates substantially at a desired level.

These and other objects are attained in a CMOS phase interpolation system formed in accordance with the present invention. The system comprises a capacitive integration unit coupled to a charge node and a plurality of selectively enabled current source units operably coupled to the charge node. Each of the current source units includes: a charging segment; a discharging segment; and, a switching segment operable responsive to at least one periodic reference signal to selectively couple the charging and discharging segments to the charge node for alternatively charging and discharging the capacitive integration unit therethrough. The current source units are selectively enabled in predetermined combinations to uniquely define an output waveform at the charge node. The system further comprises an output conditioning unit coupled to the charge node for generating at an output node a recovered periodic signal based on the output waveform.

In certain exemplary embodiments, the system also comprises a duty cycle correction unit coupled to feed back from the output node to a bias node coupled to each of the current source units. The duty cycle correction unit operates to adaptively bias a current generated in the charging segment of each enabled one of the current source units, in a manner responsive to the recovered periodic signal.

Specific applications of the invention include a phase interpolation method provided in accordance with certain other embodiments, by which a phase shifted clock signal is recovered based upon a reference clock. The method comprises establishing a capacitive integration unit coupled to a charge node and establishing an output conditioning unit coupled to the charge node. The method further comprises establishing in CMOS a plurality of current source units operably coupled to the charge node, with each current source unit including: a charging segment; a discharging segment; and, a switching segment coupled to the charging and discharging segments. A combination of the current source units are selectively enabled, such that in each enabled current source unit the switching segment is driven responsive to a plurality of reference clock signals to selectively couple the charging and discharging segments to the charge node for alternatively charging and discharging the capacitive integration unit therethrough. The reference clock signals for the enabled current source unit are offset in phase one from the other by a predetermined angle.

An output waveform is thereby uniquely defined at the charge node responsive to a plurality of enabled combinations of current source units. The output waveform is passed through the output conditioning unit which executes a comparator function relative to a predetermined reference to generate at an output node a recovered clock signal based on the output waveform. The recovered clock signal is fed back to a duty cycle correction unit coupled between the output node and a bias node coupled to a variable current source in the charging segment of each enabled one of the current source units. The duty cycle correction unit executes to adaptively bias a current generated through the variable current source, in a manner responsive to the recovered clock signal. The duty cycle correction unit is tuned in the embodiment according to a preset tuning voltage reference.

DETAILED DESCRIPTION OF THE PREFERRED EMBODIMENTS

Figure 1:
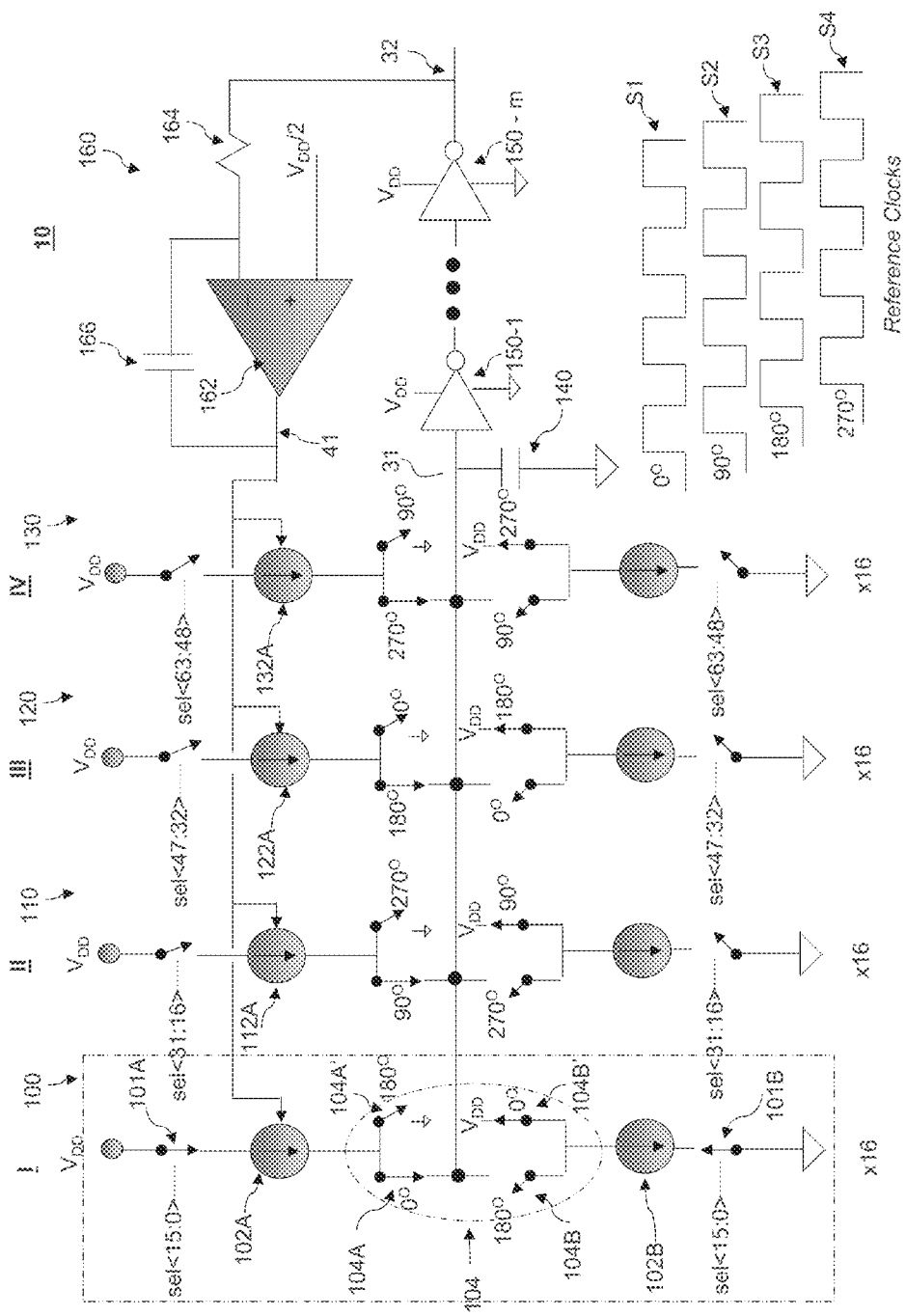
FIG. 1 is a diagram schematically illustrating the interconnection of representative units in a system formed in accordance with one exemplary embodiment of the present invention, in a first operational setting.

Wherever possible in the following description, similar reference numerals will refer to corresponding elements and parts in different Drawings unless otherwise indicated.

Figure 2:
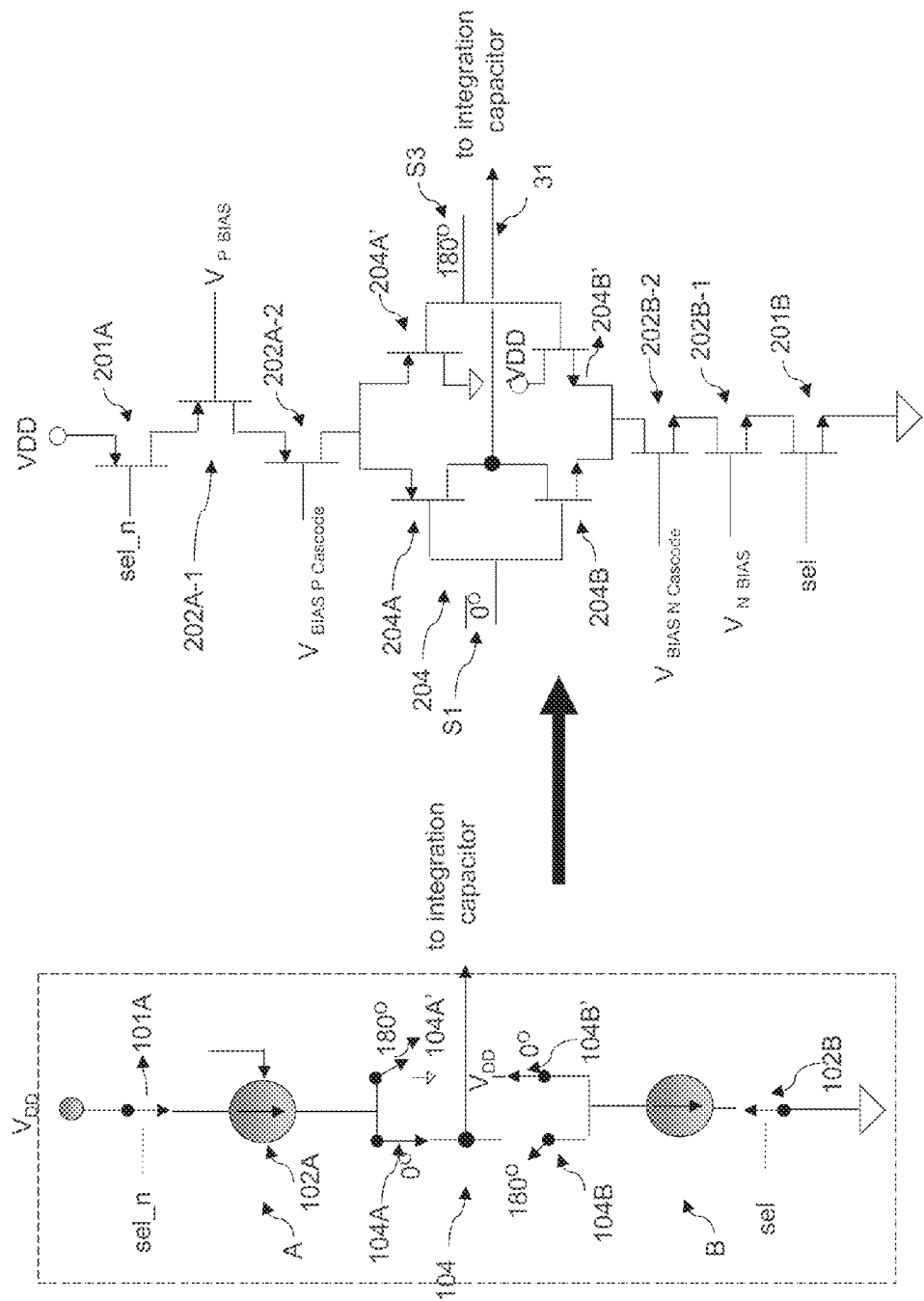
FIG. 2 is a diagram schematically illustrating an exemplary CMOS implementation of a part of the embodiment illustrated in FIG. 1.

Referring to FIGS. 1-2, there is schematically illustrated a phase interpolator system 10 formed in accordance with one exemplary embodiment of the present invention. This phase interpolator system 10 is implemented using CMOS logic circuitry, but is configured to simply and accurately generate a phase interpolated clock signal whose duty cycle is effectively maintained substantially at a preset duty cycle, such as 50%. Phase interpolator system 10 is configured in accordance with one aspect of the present invention to do this while minimizing the number of logic gates required in the prevailing signal path.

In broad concept, phase interpolator system 10 includes a plurality of selectively-actuated current source units 100, 110, 120, 130 grouped into successive stages I, II, III, IV. When selected, each current source unit 100, 110, 120, 130 is switched responsive to one or more reference clock signals $S_1$, $S_2$, $S_3$, $S_4$ which are of common frequency but offset in phase one from the other by predetermined extent (by 90° in the embodiment shown, to define reference phase shift values at 0°, 90°, 180°, and 270°). As described in following paragraphs, a plurality of like-configured current source units 100 are grouped in stage I, like-configured current source units 110 in stage II, like-configured current source units 120 in stage III, and like-configured current source units 130 in stage IV. Sixteen current source units are grouped in each of the four stages I-IV in the 6-bit embodiment shown, such that 64 distinct phase shift values may be defined within a 360° clocking cycle. A 6-bit digital word may be used, then, to programmably select different combinations of the current source units 100, 110, 120, 130 for actuation.

Figure 3A:
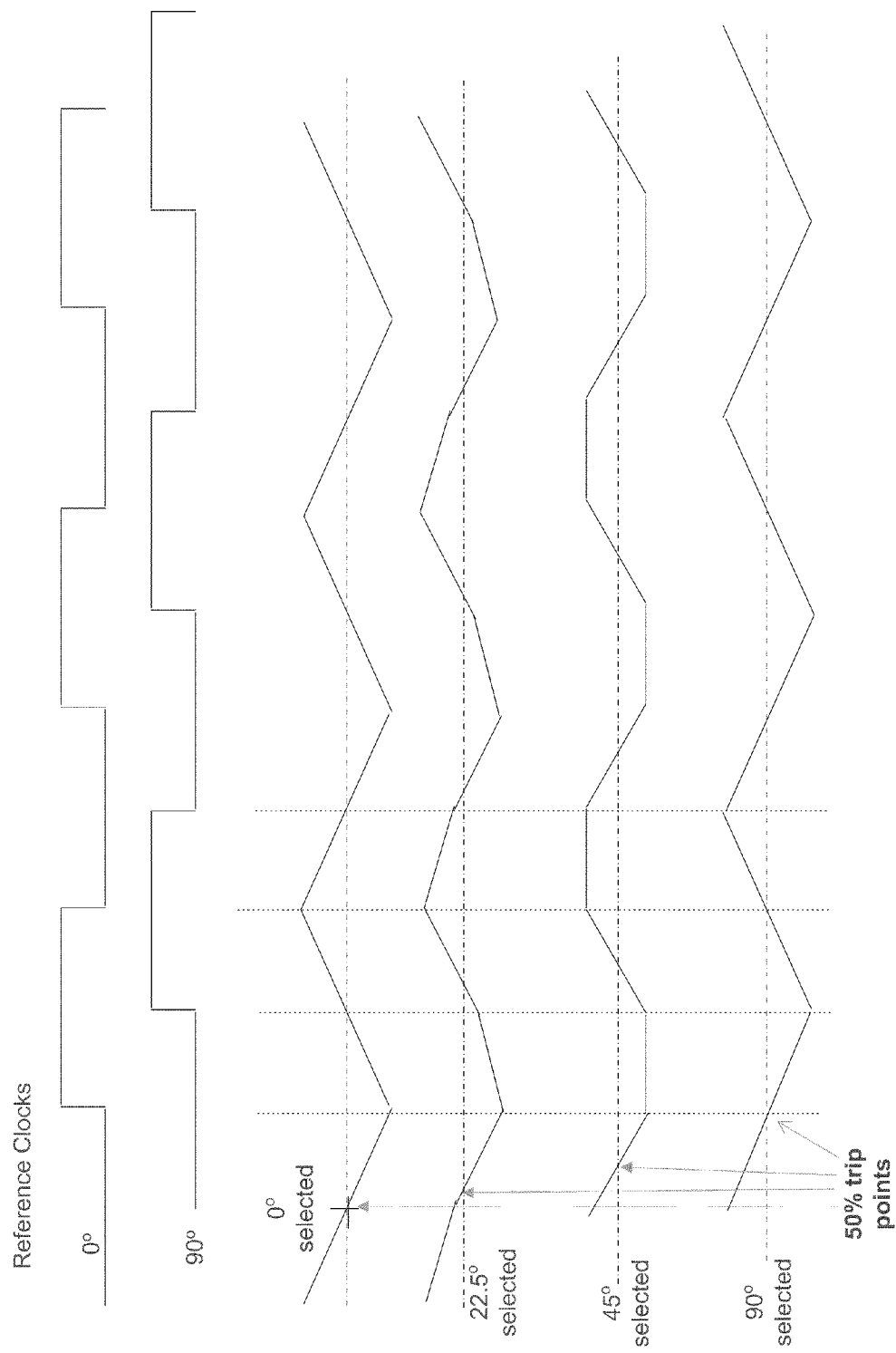
FIG. 3A comparatively illustrates a plurality of waveforms generated at a charge node portion of the embodiment of FIG. 1, at different operational settings relative to certain reference signals.
Figure 3B:
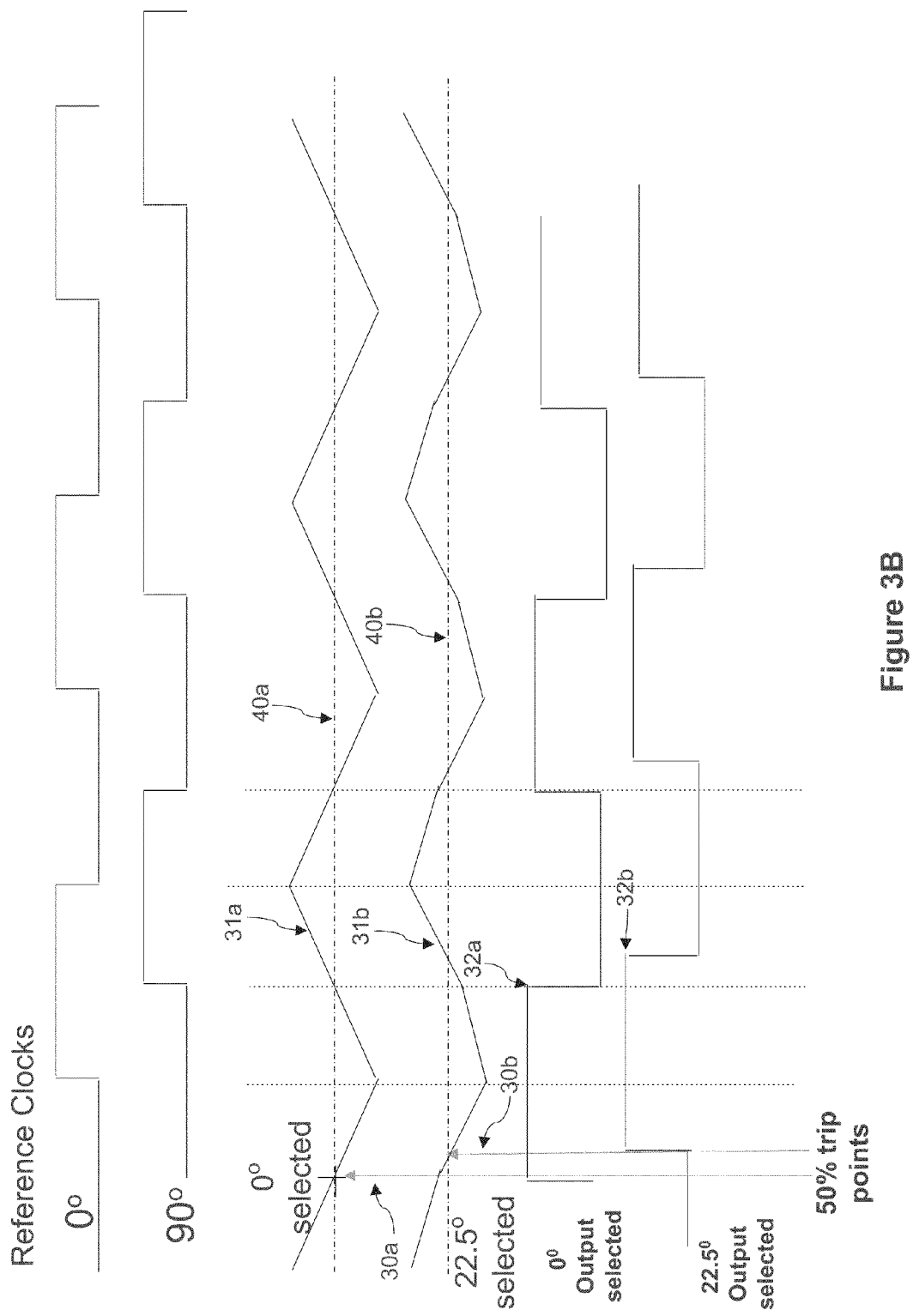
FIG. 3B comparatively illustrates a plurality of waveforms generated at different portions of the embodiment of FIG. 1, at different operational settings relative to certain reference signals.

During a first portion of the reference clocking cycle, the selectively-actuated current source units 100, 110, 120, 130 serve to charge a capacitive integration unit 140. During a subsequent portion of the reference clocking cycle, the capacitive integration unit 140 is permitted to discharge. The combined effect of this (with the contributions of all selectively actuated current source units) is a voltage at the capacitive integration unit 140 having a ramped waveform (such as illustrated in FIGS. 3A-3B), based on which an output clock signal may be defined, or 'recovered.' The enabled combination of current source units 100, 110, 120, 130 thus synthesize the recovered clock signal, with each phase interpolated version of the recovered clock signal being synthesized by a unique combination of enabled current source units.

As illustrated, an output conditioning unit 150 preferably converts the ramped voltage waveform at the integration unit 140 to a square clock waveform corresponding thereto. This recovered clock waveform reflects the desired phase shift (relative to a baseline in-phase reference clock), as determined by the combination of current source units 100, 110, 120, 130 selected for actuation.

Output conditioning unit 150 is preferably configured as a cascaded series of biased delay elements 150-1 . . . 150-$m$, each configured as an amplifier with inverting gain. The elements 150-1 . . . 150-$m$ receive a ramped, or triangular waveform, and outputs a square waveform, as described in following paragraphs (in connection with FIGS. 3A-3B).

The first, second, third, and fourth stages I-IV of current source units 100, 110, 120, 130 are coupled to a charge node 31. The current source units 100 in the first set are each individually selectable for actuation and coupled for complimentary switching by a first pair of reference clock signals $S_1$, $S_3$ separated in phase by half the clocking cycle (at 0° and 180° phase shifts, respectively). Each of the current source units 110, 120, 130 in the respective stages II-IV is likewise selectable individually for actuation and coupled for complimentary switching by a corresponding pair of referenced clock signals separated in phase by half the clocking cycle ($S_2/S_4$ at 90° and 270° phase shifts in stage II, $S_3/S_1$ at 180° and 0° phase shifts in stage III, and $S_4/S_2$ at 270° and 90° phase shifts in stage IV).

With each of the four stages I-IV in the illustrated embodiment encompassing 16 individually actuable current source units, the 90° phase separation between reference clock signals $S_1$-$S_4$ of successive stages I-IV may be covered by 16 phase interpolation points. The full 360° clocking cycle would then be defined by 64 total phase shift increments, any one of which may be tapped by suitable selection of corresponding current source units 100, 110, 120, 130 in generating a recovered clock signal.

In accordance with an aspect of the present invention, phase interpolator system 10 further includes a duty cycle correction unit 160 feeding back from the output conditioning unit 150 to the current source units 100, 110, 120, 130. The duty cycle correction unit 160 is coupled to provide a biasing signal at a bias node 41 coupled to a variable primary current source 102A, 112A, 122A, 132A in each of the current source control units 100, 110, 120, 130. The biasing signal adjusts the amount of current passed by each primary current source 102A, 112A, 122A, 132A during the charging of the capacitive storage unit 140. The effect of this charging current adjustment is to correspondingly adjust the average voltage level at the charging node 31.

Figure 3C:
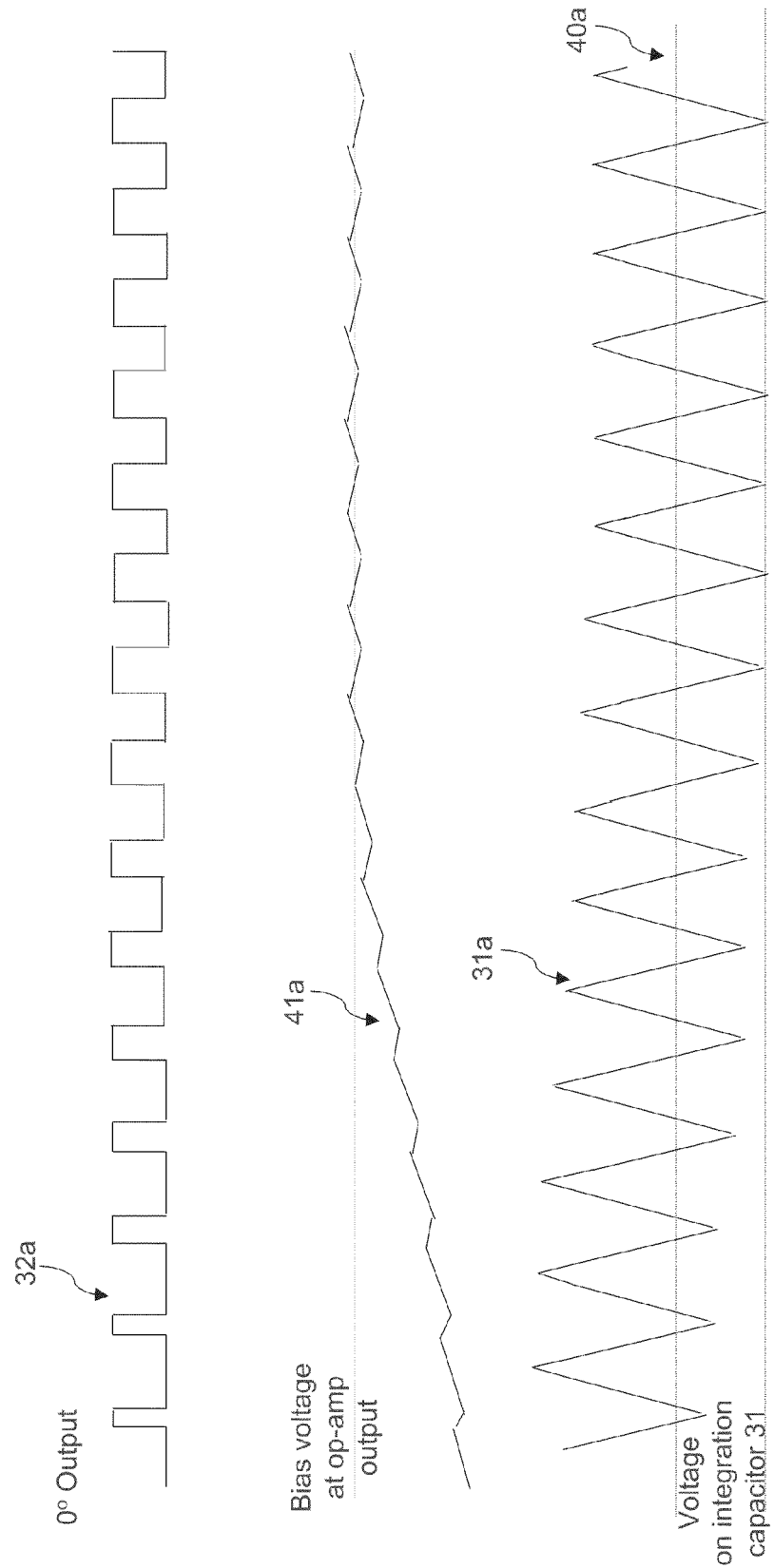
FIG. 3C comparatively illustrates a plurality of waveforms generated at different portions of the embodiment of FIG. 1 in connection with an adaptive duty cycle correction feature; and, FIG. 4 illustrates a table of digital states for selection lines decodable according to a 5-bit selection word employed, for example, to select 32 phase interpolation states in an alternate embodiment of the present invention.

Referring to the illustration of waveforms in FIGS. 3A-3C, the output conditioning unit 150 preferably carries out a comparator function in formulating the recovered clock signal, whereby an amplitude threshold (indicated by the broken lines 40a, 40b) is effectively applied to the ramped waveform 31a, 31b (illustrated for 0° and 22.5° phase shift examples) resulting at the charging node 31. Biasing the charging node's waveform up or down in amplitude thus has the effect of sliding the state transition, or 'trip,' points 30a, 30b for the recovered clock signal 32a, 32b back and forth in time—thereby, adjusting its duty cycle.

Preferably, the duty cycle correction unit 160 employs an operational amplifier 162 configured as an integrator to maintain adaptive control over the biasing signal applied to each of the current source units' primary current sources 102A, 112A, 122A, 132A. This biasing signal control is based upon the recovered clock signal provided by the conditioning unit 150 at output node 32. Integrator amplifier 162 is configured in the illustrated embodiment to automatically maintain the biasing signal to yield a 50% duty cycle. That is, the amplifier's non-inverting input is coupled to a voltage reference having a voltage level defined by $V_{DD}*D$, where D denotes a predetermined duty cycle factor, such as ½ for the 50% duty cycle shown. One skilled in the art will recognize that the integrator amplifier 162 may be suitably 'tuned' to maintain a different duty cycle value by, among other things, adjusting the reference voltage applied to the amplifier's non-inverting input in this manner to something other than the $V_{DD}/2$ value shown.

The exemplary duty cycle correction unit 160 further includes a resistor 164 connected between the output node 32 and an inverting input of the amplifier 162, its non-inverting input being tied to the reference voltage $V_{DD}/2$. An integrating capacitor 166 is connected to feed back from the amplifier's summing node (coupled to the bias node 41) to its inverting input, as shown.

With this configuration, amplifier 162 operates generally towards keeping its non-inverting and inverting input equal in signal level. When the signal at output node 32 is high, current flows through resistor 164 into the amplifier's inverting input. Conversely, when the signal at output node 32 is low, current flows in the opposite direction—from the amplifier's summing node, through integrating capacitor 166 and resistor 164. The resistor 164 and capacitor 166 are suitably selected in value (for example, with the capacitor 166 having a relatively large capacitance) to yield a sufficiently high time constant, that the amplifier's output voltage remains relatively stable, with little variation during operation.

FIG. 3C illustrates the duty cycle correction unit's initial acquisition and stable maintenance of the desired duty cycle, for the case in-phase 0° shift recovery of the clock signal 32a. As the biasing signal 41a (at bias node 41) builds substantially to its steady state level, the ramped voltage waveform 31a generated at the charge node 31 undergoes a corresponding shift in amplitude relative to the effective threshold level 40a imposed by the output conditioning unit 150. This results in a concurrent correction of the recovered clock signal 32a in duty cycle to the desired level, at which it remains upon reaching.

In the illustrated embodiment, a clocking cycle is divided into 64 distinct steps by which the phase may be shifted (relative to an in-phase 0° reference clock). The 64 states represented by these phase shift steps may each be uniquely selected by a 6-bit digital selection word, according to which different combinations of the 64 current source units 100, 110, 120, 130 disposed over the four stages I-IV may be selectively actuated.

Preferably, the current source units 100, 110, 120, 130 are individually switched responsive to the state of their respective selection lines SEL <0> . . . SEL <63> as indicated in FIGS. 1-2. In a first state, for example, the digital selection word may be set with a first binary value decodable to set the first 16 selection lines SEL <0> . . . SEL <15> to a high (or other enabling) while the remaining selection lines SEL <16> . . . SEL <63> are each kept at a low (or other disabling) level. All 16 current source units 100 of the first stage I would then be activated while the current source units 110, 120, 130 of the remaining stages II-IV remain inactive, such that an in-phase (0°) recovered clock signal is generated.

In the next state, the digital selection word may be set with a second binary value, so that the group of 16 selection lines set to the high level may be incremented by one. Selection lines SEL <1> . . . SEL <16> would then be set to the high level while selection lines SEL <0> and SEL <17> . . . SEL <63> are kept at the low level. Accordingly, 15 of the 16 first current source units 100 are activated, along with one of the 16 second current source units 110, while the other current source units 100, 110, 120, 130 remain inactive, to generate a recovered clock signal that is shifted by one phase step, 5.625° (${1/64}^{th}$ of a full 360° clocking cycle).

As the next set of 16 consecutive current source units (within one or within adjacent stages I-IV) is selected by setting their corresponding selection lines SEL <i> . . . SEL <i+15> to the high level in this manner, the phase shift to be incorporated is correspondingly stepped to the next level. A 'sliding window' approach is thus implemented, whereby a distinct group of 16 current source units are actuated exclusive of the others to impose a particular level of phase shift (upon the baseline in-phase clock reference) in generating the recovered clock signal.

Figure 4:
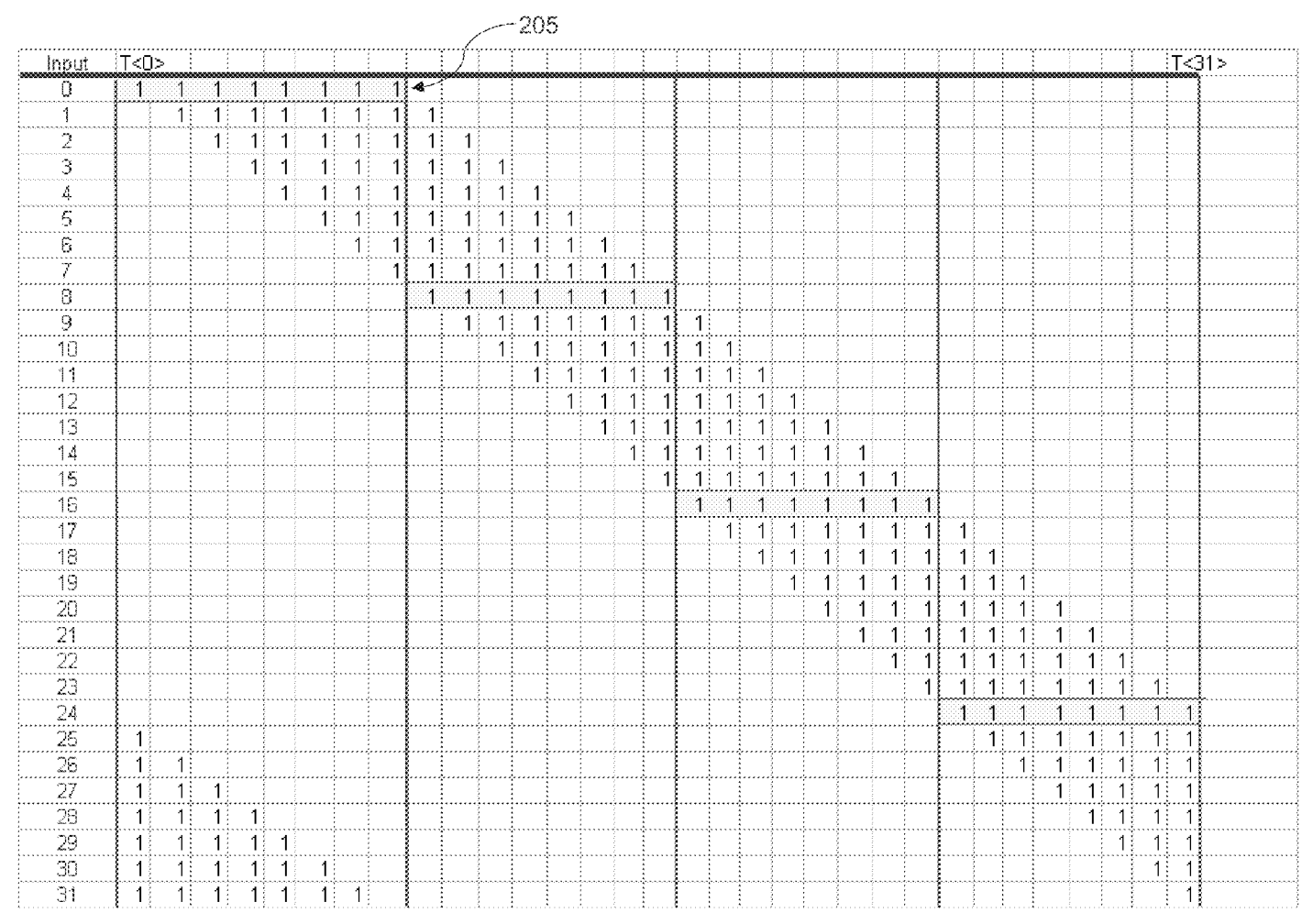

The 6-bit, 64 state, phase interpolation scheme illustrated in the disclosed embodiment is but one example of a phase interpolator system which may be implemented in accordance with the present invention. For example, FIG. 4 illustrates a digital encoding scheme example for a 5-bit implementation of the phase interpolation system. In this example, the clocking cycle is divided into 32 different phase shift states corresponding to 32 levels of phase shift which are incrementally stepped by 11.25° (360°/32).

In the example of FIG. 4, the individual digital states are shown across the horizontal axis for the selection lines T<0> . . . T<31> of current source units 210', 220', 230', 240' grouped in successive stages of such units, much as in FIGS. 1-2. The 32 phase shift levels, 0-31, are shown along the vertical axis. The first, or 0° phase shift, level is selected by setting only the first eight selection lines T<0> . . . T<7> to a high (or other enabling) level, while keeping the remaining 24 lines at a low (or other disabling) level.

As the window of actuation 205 effectively 'slides' along the selection lines, the phase shift amount is stepped accordingly. At the 90° phase shift level (step 8), only the eight current source units 220' within the second stage are activated. The 180° and 270° phase shifts (steps 16 and 24) are similarly imposed by exclusively activating those current source units 230', 240' within just their own corresponding stages (third and fourth). At step 31, or the 348.75° phase shift level, seven of the eight current source units 210' within the first stage are activated along with one of the eight current source units 240' within the fourth stage.

More generally, a wide range of phase interpolation steps may be defined within a clocking cycle. Where n current source units are provided, certain combinations of such units may be selectively enabled responsive to a corresponding number of selection lines decoded in accordance with an s-bit selection word, where $s=\log_2 n$. As described in following paragraphs, enabling switches provided in each current source unit may then be switched responsive to at least one designated selection line.

Phase interpolator system 10 in accordance with the present invention thus operates to recover and output a clock reference signal that is digitally phase-shifted with respect to a chosen reference clock. A low jitter, synchronized output clock having the desired phase is recovered from one or more reference clock sources. Among other things, this enables a receiving circuit running on a different crystal oscillator different from that of a sending circuit to nonetheless receive data reliably, upon recovery of a local clock synchronized to the sending clock with very low jitter.

Figure 1A:
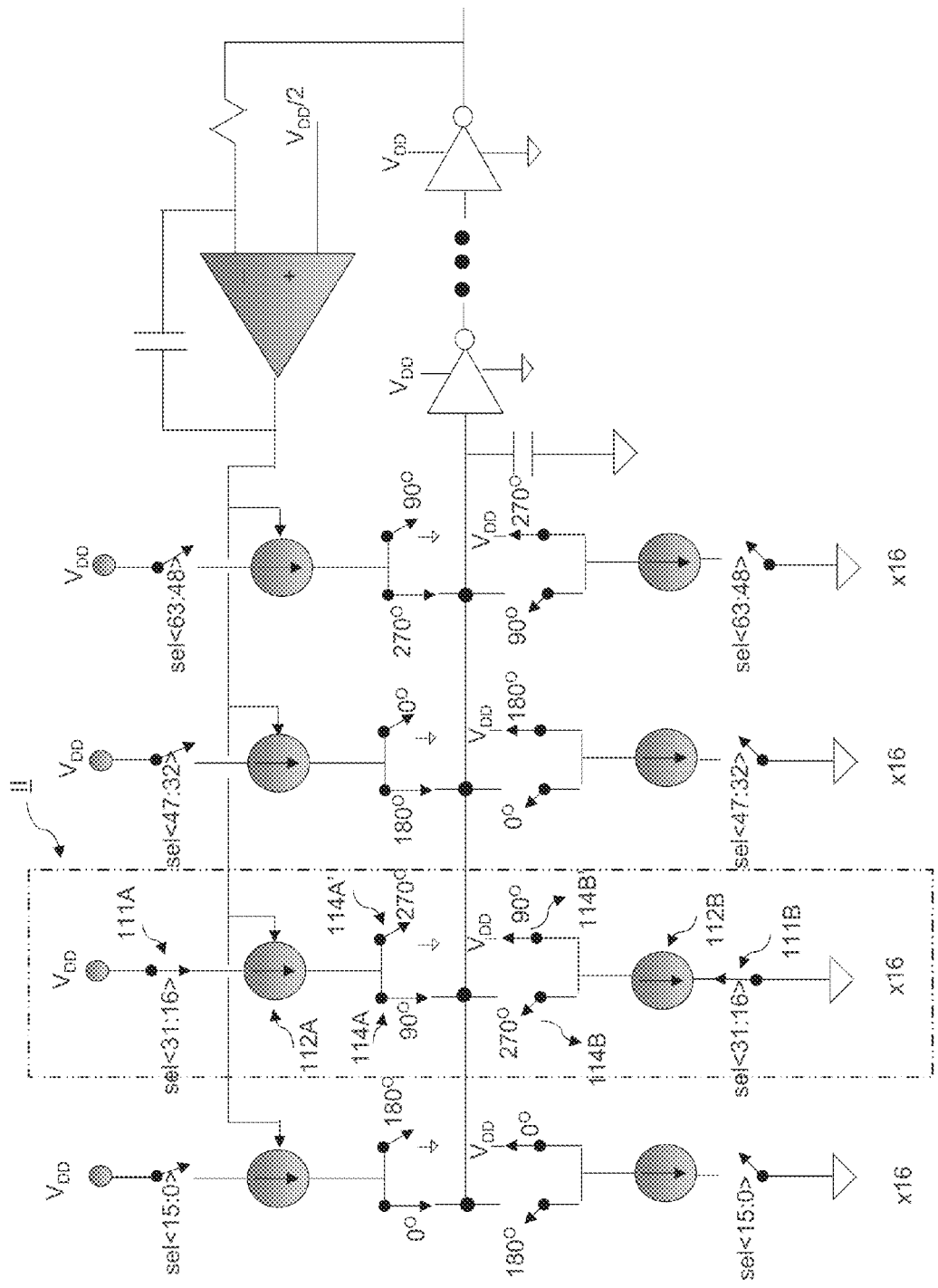
FIG. 1A is a diagram schematically illustrating the interconnection of representative units in the embodiment of FIG. 1, in a second operational setting.
Figure 1B:
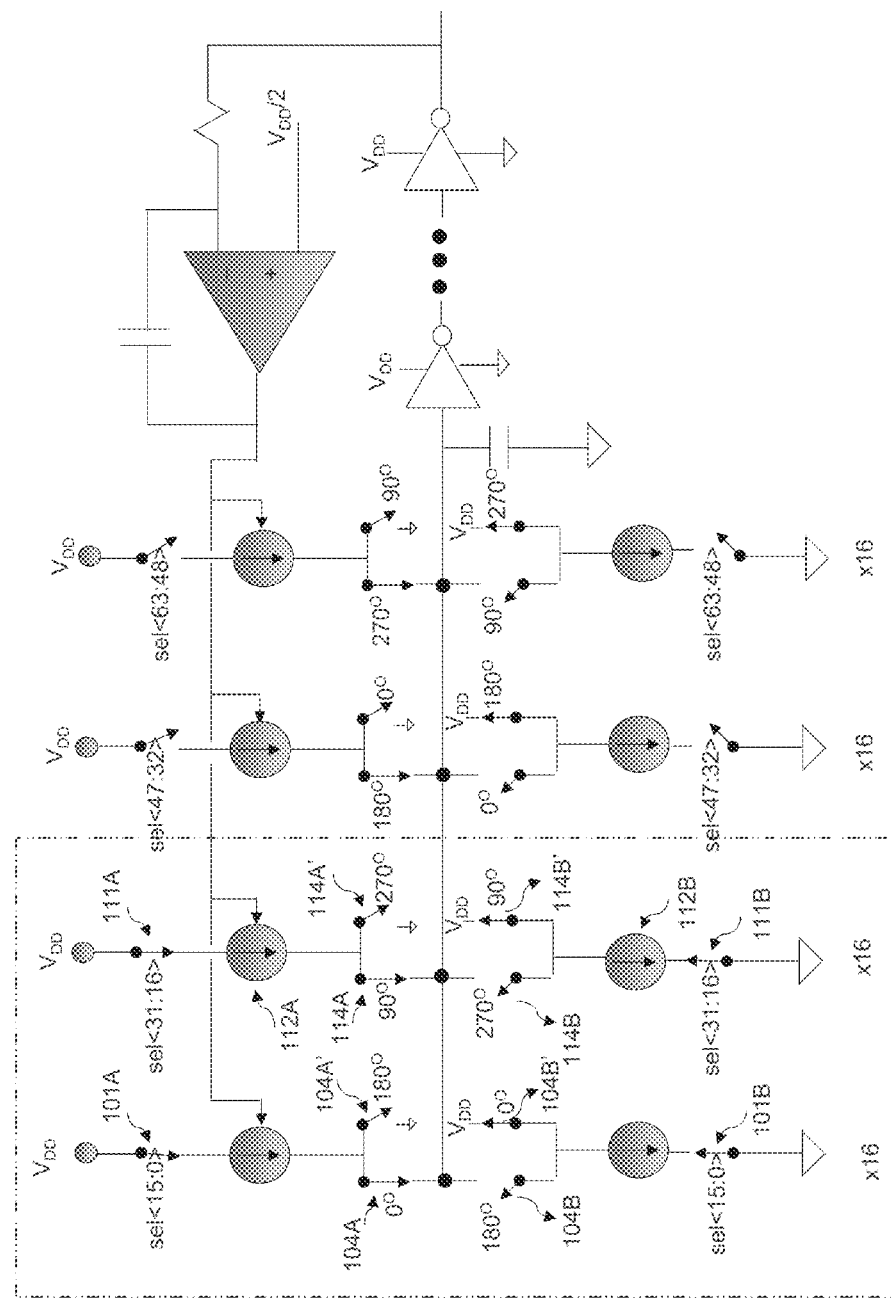
FIG. 1B is a diagram schematically illustrating the interconnection of representative units in the embodiment of FIG. 1, in a third operational setting.

Turning more closely to FIGS. 1 and 1A-1B, each individual current source unit 100, 110, 120, 130 is similarly configured—though each is enabled by a separate selection line, and the reference clock signals coupled thereto (for driving its charging/discharging cycles) depends on the particular stage I-IV to which it belongs. For simplicity, the representative configuration of these units is described with reference to a current source unit 100 belonging to the first stage I.

Current source unit 100 includes complimentary segments A and B each having an enabling switch 101A, 101B closed and opened responsive to the same selection line SEL <i>. The complementary segments A and B are alternatively coupled to the charge node 31 by an intermediate switching segment 104 whose selection switches 104A, 104A', 104B, 104B' are switched responsive to reference clock signals $S_1$, $S_3$, as shown. During operation, unit 100 is enabled upon activation of its selection line SEL <i> which closes the enabling switches 101A, 101B in both segments A, B. Closure of the enabling switches 101A, 101B operates to couple the primary current source 102A (of segment A) and secondary current source 102B (of segment B) respectively to high and low references ($V_{DD}$ and ground in the illustrated embodiment).

The selection switches 104A, 104A' of the intermediate switching segment 104 are switched according to 'complementary' reference clock signals $S_1$, $S_3$ (180° apart in phase in the illustrated embodiment) so that when selection switch 104A is closed, selection switch 104A' is open. At this operational state, current flows from the primary current source 102A into the charge node 31, so as to charge the capacitive integration unit 140. Other current source units 100 which have been enabled by their selection lines also contribute to the charging current at node 31 in this manner. Conversely, when selection switch 104A is opened to disconnect from the charge node 31, selection switch 104A' is closed to define an alternate current path from the primary current source 102A to ground. Other enabled current source units 100 follow in like manner to disconnect the integration unit charging paths.

It is during this time that segment B is connected by the intermediate switching segment 104 to establish a discharge path from the capacitive integration unit 140 (at charge node 31) to ground. The selection switches 104B, 104B' are switched according to complementary reference clock signals $S_3$, $S_1$, such that the selection switch 104B at this time is closed, while its complementary selection switch 104B' is open. A current path is thereby established from the charge node 31 to the secondary current source 102B, and through the first section switch 101B, on to ground. Other current source units 100 which have been enabled by their selection lines similarly provide discharge paths for node 31.

When selection switch 104B is opened to disconnect segment B from the charge node 31, selection switch 104B' is closed to tie the secondary current source 102B alternatively to voltage reference $V_{DD}$. Charging of the integration unit 140 may occur through segment A during this time, with segment B remaining safely disconnected from charge node 31, though it may still be enabled by its enabling switch 101B.

Each of the current source units 110, 120, 130 in the other stages II-IV undergo similar operation. As shown, the selection switches in these other stage current source units are driven by different combinations of complementary reference clock signals $S_2/S_4$, $S_1/S_3$, with the reference clock signals in successive neighboring stages preferably being offset in phase by 90°.

FIG. 1A illustrates an operational configuration for generating a 90° phase-shifted clock (with respect to $S_1$). In this operational configuration, only the current source units 110 of the second stage II are enabled by the selection lines SEL <16> . . . SEL<31> closing their enabling switches 111A, 111B. Each of the 16 current source units 110 may then contribute a component of the charging current for the capacitive integration unit 150 during the charging state shown, where the selection switch 114A of each unit 110 is closed responsive to the 90° reference clock signal $S_2$ to connect the primary current source 112A to the charge node 31. At this time, selection switches 114A' and 114B driven by the complementary reference clock signal $S_4$ are both open, while selection switch 114B' simply ties the unit's segment B to reference $V_{DD}$.

FIG. 1B illustrates an operational configuration for generating a 45° phase-shifted clock (with respect to $S_1$). In this operational configuration, the 'sliding window' of enabled current source units extends across portions of both stage I and its neighboring stage II. Sixteen current source units 100, 110 are still enabled in this operational configuration, but eight belong to stage I and eight belong to stage II. Their combined contributions yield at charge node 31 the ramped 45° waveform illustrated in FIG. 3A. The waveform is squared upon passage through the output conditioning unit 150, the according to the predetermined amplitude trip point reference effected thereby.

This trip point reference may be established by any suitable means known in the art. In the exemplary embodiment disclosed, the trip point is effectively predetermined by the intrinsic properties of certain devices forming the output conditioning unit 150. The individual inverter elements 150-1 . . . 150-m, for example, are preferably formed in the embodiment with NMOS and PMOS transistor devices; and, the relative strengths of these devices serve to determine the trip point reference effectively established by the output conditioning unit 150.

In the charging state shown for this configuration, the eight current source units 100 corresponding to selection lines SEL <8> . . . SEL <15> and the eight current source units 110 corresponding to selection lines SEL <16> . . . SEL <23> are enabled by activating such selection lines to close the first section switches 101A, 101B, 111A, 111B. All current source units other than the 16 units so enabled remain disabled in accordance with this particular embodiment. The selection switches 104A, 104B' of unit 100 and the selection switches 114A, 114B' of unit 110 are then closed accordingly in response to reference clock signals $S_1$, $S_2$, during that portion of the clocking cycle where the other selection switches 104A', 104B, 114A', 114B in each unit are open in response to the complementary reference clock signals $S_3$, $S_4$.

Since the reference clock signals driving the units' corresponding selection switches in neighboring stages are offset by 90° in phase, corresponding selection switches of the units 100 enabled in stage I and of the units 110 enabled in stage II will be closed concurrently during just a half portion of the charging period within a clocking cycle. The selection switches of only the units 100 on the one hand, and the selection switches of only the units 110 on the other, will be closed during the remaining portions of the charging period. The collective result is a ramped waveform at charge node 31 that is substantially spread in amplitude to form a 45° shifted clock signal when squared at the effective trip points suitably established by the output conditioning unit 150.

The reference clock signals $S_1$-$S_4$ employed in the illustrated embodiment are phase shifted versions of the same clock signal having a 50% duty cycle. Hence, the duty cycle correction unit 160 is configured in consistent manner to adaptively control the charging segments of the current source units, such that the recovered clock signal effectively converges also to a 50% duty cycle. The complementarily paired reference clock signals driving the selection switches of each current source unit are likewise provided in consistent manner to be offset in phase by a ½ cycle.

Were a clock signal having a different duty cycle to be employed in alternate embodiments, these and other such parametric relationships would be suitably varied. Depending on the reference clock's duty cycle, for example, the number of phase offset reference clock signals employed may be other than four; the phase offset between complimentarily paired reference clock signals may be other than ½ cycle; and, the duty cycle correction unit may cause convergence of the recovered clock signal at a level other than 50%.

FIG. 2 schematically illustrates a more detailed CMOS circuit implementation of the current source unit 100 in accordance with one exemplary embodiment of the present invention. In the interests of clarity and brevity, the circuit implementation only for the representative case of a stage I current source unit 100 is illustratively shown; however, a corresponding implementation may be suitably employed for the current source units 110, 120, 130 of the other stages II-IV.

In the illustrated embodiment, the enabling switch 101A of the current source unit 100 is formed preferably by a P-channel MOSFET device 201A, and the primary current source 102A is formed collectively by p-channel MOSFET devices 202A-1, 202A-2. The pMOS device 201A is connected with its source coupled to reference voltage $V_{DD}$ and its drain coupled to the source of pMOS device 202A-1. The drain of device 202A-1 is in turn coupled to the source of pMOS device 202A-2. The gate of pMOS device 201A is tied to the given unit's designated selection line sel_n. The gate of the primary current source pMOS device 202A-2 is coupled to a predetermined bias signal $V_{BIAS\ P\ Cascode}$, while the gate of the current source's other pMOS device 202A-1 is tied to the adaptive bias signal $V_{P\ BIAS}$ provided in accordance with the present invention by the duty cycle correction unit 160. This adaptive bias signal $V_{P\ BIAS}$ maintains suitable control over the conduction path established by pMOS device 202A-1 to regulate the current passing therethrough, and the given unit's contribution as a result to the collective voltage at charge node 31.

Segment B of the current source unit 100 is implemented in this embodiment with an n-channel MOSFET device 201B forming the enabling switch 101B, and the n-channel MOSFET devices 202B-1, 202B-2 collectively forming the secondary current source 102B. nMOS device 201B is connected with its source coupled to ground and its drain coupled to the source of nMOS device 202B-1. The drain of nMOS device 202B-1 is coupled to the source of nMOS device 202B-2. The gate of nMOS 201-B is tied to the complement (sel) of the designated selection line sel_n driving the enabling switch pMOS device 201A in segment A of the unit 100. Devices 202B-1, 202B-2 are provided with their respective gates tied to the fixed bias signals $V_{N\ BIAS}$, $V_{BIAS\ N\ Cascode}$ as shown.

The intermediate switching segment 104 is formed by the interconnection of pMOS devices 204A, 204A' and nMOS devices 204B, 204B'. NMOS device 204A is connected with its source coupled to the drain of pMOS device 202A-2 and its drain coupled to the charge node 31. NMOS device 204B is connected with its source coupled to the drain of nMOS device 202B-2 and its drain coupled to the charge node 31. The gates of the pMOS and nMOS devices 204A, 204B are commonly tied to the appropriate reference clock signal—in the case of this stage I unit 100, the 0° in phase reference clock signal $S_1$. PMOS device 204A' is connected with its source tied to the drain of pMOS device 202A-2 and its drain coupled to ground, while nMOS device 204B' is connected with its source coupled to the drain of nMOS device 202B-2 and drain coupled to voltage reference $V_{DD}$. The gates of pMOS and nMOS devices 204A', 204B' are commonly tied to the appropriate reference clock signal—in the case, the 180° shifted clock signal $S_3$. In actuality, the complements of the in-phase and 180° shifted reference clock signals are preferably applied at the gates of the intermediate switching segment's devices in the particular embodiment shown.

One skilled in the art will recognize that relative polarities and other such factors may be suitably varied in alternate embodiments, depending on the specific requirements of the intended application. One skilled in the art will also recognize that various other combinations and interconnections of suitable transistor devices known in the art may be employed in other such alternate embodiments.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A CMOS phase interpolation system comprising:
a capacitive integration unit coupled to a charge node;
a plurality of selectively enabled current source units operably coupled to uniquely define an output waveform at said charge node, each of said current source units including:
   a charging segment;
   a discharging segment; and,
   a switching segment operable in response to at least one periodic reference signal to selectively couple said charging and discharging segments to said charge node, one exclusive of the other, for alternatively charging and discharging said capacitive integration unit therethrough; and,
an output conditioning unit coupled to said charge node for generating at an output node a recovered periodic signal based on said output waveform.

2. The system as recited in claim 1, wherein said current source units are selectively enabled in predetermined combinations to uniquely define said output waveform at said charge node.

3. The system as recited in claim 2, wherein a predetermined number (n) of said current source units are coupled to said charge node, selective combinations of said current source units being enabled to define n phase shift steps for the recovered periodic signal within one 360° cycle of the periodic reference signals.

4. The system as recited in claim 3, wherein in each of said current source units:
said charging segment includes at least a primary current source coupled to a first voltage reference by a first enabling switch;
said discharging segment includes at least a secondary current source coupled to a second voltage reference by a second enabling switch; and,
said switching segment includes: a first set of selection switches driven responsive to at least one of said reference periodic signals to alternatively couple said primary current source to said charge node and the second voltage reference; a second set of selection switches driven responsive to at least one of said reference periodic signals to alternatively couple said secondary current source to said charge node and the first voltage reference.

5. The system as recited in claim 4, wherein each of said first and second sets of selection switches includes one selection switch driven by one of said reference periodic signals and a complementary selection switch driven by a phase shifted version of said one reference periodic signal.

6. The system as recited in claim 5, wherein said one reference periodic signal defines a 50% duty cycle, and said phase shifted version of said reference periodic signal is offset in phase therefrom by 180°.

7. The system as recited in claim 6, wherein said current source units are grouped evenly within four stages, said reference periodic signal for said current source units in successive ones of said stages being offset one from the other in phase by 90°.

8. The system as recited in claim 5, wherein said charging, discharging, and switching segments of each said current source unit are formed by a plurality of circuit integrated n-channel and p-channel MOSFET devices.

9. The system as recited in claim 4, wherein said current source units are selectively enabled responsive to n selection lines decoded in accordance with an s-bit selection word, where $s=\log_2 n$; said first and second enabling switches of each said current source unit being switched responsive to at least one said selection line.

10. The system as recited in claim 4, wherein said duty cycle correction unit includes:
an operational amplifier having inverting and non-inverting input terminals and an output terminal, said output terminal being coupled to said bias node;
a capacitor coupled between said inverting terminal and said bias node; and,
a resistor coupled between said inverting input terminal and said output node;
wherein said non-inverting input terminal is coupled to a third voltage reference, said third voltage reference having a voltage level defined by $V_{DD}*D$, where $V_{DD}$ denotes said first voltage reference and D denotes a predetermined duty cycle factor;
said primary current source of each said current source unit having a conduction path control terminal coupled to said bias node.

11. The system as recited in claim 4, wherein said output conditioning unit includes a plurality of cascaded inverter devices each configured to execute a comparator function relative to a predetermined reference.

12. A CMOS phase interpolation system comprising:
a capacitive integration unit coupled to a charge node;
a plurality of selectively enabled current source units operably coupled to uniquely define an output waveform at said charge node, each of said current source units including:
   a charging segment;
   a discharging segment; and,
   a switching segment operable in response to at least one periodic reference signal to selectively couple said charging and discharging segments to said charge node for alternatively charging and discharging said capacitive integration unit therethrough;
an output conditioning unit coupled to said charge node for generating at an output node a recovered periodic signal based on said output waveform; and,
a duty cycle correction unit coupled to feed back from said output node to a bias node coupled to each of said current source units, said duty cycle correction unit adaptively biasing a current generated in said charging segment of each enabled one of said current source units responsive to said recovered periodic signal.

13. A CMOS phase interpolation system for recovering a phase shifted clock signal based upon a reference clock comprising:
a capacitive integration unit coupled to a charge node;
a predetermined number (n) of selectively enabled current source units operably coupled to uniquely define an output waveform at said charge node, each of said current source units including:
   a charging segment;
   a discharging segment; and,
   a switching segment operable in response to a plurality of reference clock signals to selectively couple said charging and discharging segments, one exclusive of the other, for alternatively charging and discharging said capacitive integration unit therethrough;
an output conditioning unit coupled to said charge node for generating at an output node a recovered clock signal based on said output waveform;
whereby selective combinations of said enabled current source units define n phase shift steps for the recovered clock signal within a clocking cycle.

14. The system as recited in claim 13, wherein said reference clock signals are offset in phase one from the other.

15. The system as recited in claim 14, wherein in each of said current source units:
said charging segment includes at least a primary current source coupled to a first voltage reference by a first enabling switch;
said discharging segment includes at least a secondary current source coupled to a second voltage reference by a second enabling switch; and,
said switching segment includes: a first set of selection switches driven responsive to at least one of said reference clock signals to alternatively couple said primary current source to said charge node and the second voltage reference; and, a second set of selection switches driven responsive to at least one of said reference clock signals to alternatively couple said secondary current source to said charge node and the first voltage reference.

16. The system as recited in claim 15, further comprising a duty cycle correction unit coupled to feed back from said output node to a bias node coupled to each of said current source units, said duty cycle correction unit adaptively biasing a current generated by a variable current source in said charging segment of each enabled one of said current source units responsive to said recovered periodic signal.

17. The system as recited in claim 16, wherein said duty cycle correction unit includes:
an operational amplifier having inverting and non-inverting input terminals and an output terminal, said output terminal being coupled to said bias node;
a capacitor coupled between said inverting terminal and said bias node; and,
a resistor coupled between said inverting input terminal and said output node;
wherein said non-inverting input terminal is coupled to a third voltage reference, said third voltage reference having a voltage level defined by $V_{DD}*D$, where $V_{DD}$ denotes said first voltage reference and D denotes a predetermined duty cycle factor;
said primary current source of each said current source unit having a conduction path control terminal coupled to said bias node.

18. The system as recited in claim 16, wherein each of said first and second sets of selection switches includes one selection switch driven by one of said reference clock signals and a complementary selection switch driven by a phase shifted version of said one reference clock signal; said one reference clock signal defining a 50% duty cycle, and said phase shifted version of said reference clock signal being offset in phase therefrom by 180° within a 360° clocking cycle.

19. The system as recited in claim 18, wherein said current source units are grouped evenly within four stages, said reference periodic signal for said current source units in successive ones of said stages being offset one from the other in phase by 90°.

20. The system as recited in claim 19, wherein said output conditioning unit includes a plurality of cascaded inverter devices each configured to execute a comparator function relative to a predetermined reference.

21. The system as recited in claim 20, wherein said charging, discharging, and switching segments of each said current source units are formed by a plurality of circuit integrated n-channel and p-channel MOSFET devices.

22. A CMOS phase interpolation system for recovering a phase shifted clock signal based upon a reference clock signal comprising:
a capacitive integration unit coupled to a charge node;
a plurality of selectively enabled current source units operably coupled to uniquely define an output waveform at said charge node, each of said current source units including:
a charging segment;
a discharging segment; and,
a switching segment operable in response to a plurality of reference clock signals to selectively couple said charging and discharging segments to said charge node for alternatively charging and discharging said capacitive integration unit therethrough, said reference clock signals being offset in phase one from the other;
an output conditioning unit coupled to said charge node for generating at an output node a recovered clock signal based on said output waveform; and,
a duty cycle correction unit coupled to feed back from said output node to a bias node coupled to each of said current source units, said duty cycle correction unit being tuned according to a preset tuning voltage reference to adaptively bias a current generated in said charging segment of each enabled one of said current source units responsive to said recovered clock signal.

23. The system as recited in claim 22, wherein said output conditioning unit including a plurality of cascaded inverter devices each configured to execute a comparator function relative to a predetermined reference.

24. The system as recited in claim 23, wherein in each of said current source units:
said charging segment includes at least a primary current source coupled to a first voltage reference by a first enabling switch;
said discharging segment includes at least a secondary current source coupled to a second voltage reference by a second enabling switch; and,
said switching segment includes: a first set of selection switches driven responsive to at least one of said reference clock signals to alternatively couple said primary current source to said charge node and the second voltage reference; a second set of selection switches driven responsive to at least one of said reference clock signals to alternatively couple said secondary current source to said charge node and the first voltage reference.

25. The system as recited in claim 24, wherein said duty cycle correction unit includes:
an operational amplifier having inverting and non-inverting input terminals and an output terminal, said output terminal being coupled to said bias node;
a capacitor coupled between said inverting terminal and said bias node; and,
a resistor coupled between said inverting input terminal and said output node;
wherein said non-inverting input terminal is coupled to a third voltage reference, said third voltage reference having a voltage level defined by $V_{DD}*D$, where $V_{DD}$ denotes said first voltage reference and D denotes a predetermined duty cycle factor;
said primary current source of each said current source unit having a conduction path control terminal coupled to said bias node.

26. The system as recited in claim 25, wherein said current source units are grouped evenly within four stages, said reference periodic signal for said current source units in successive ones of said stages being offset one from the other in phase by 90°; and, wherein each of said first and second sets of selection switches includes one selection switch driven by one of said reference clock signals and a complementary selection switch driven by a phase shifted version of said one reference clock signal; said one reference clock signal defining a 50% duty cycle, and said phase shifted version of said reference clock signal being offset in phase therefrom by 180°.

27. A phase interpolation method for recovering a phase shifted clock signal based upon a reference clock comprising:
   establishing a capacitive integration unit coupled to a charge node;
   establishing an output conditioning unit coupled to said charge node;
   establishing in CMOS a plurality of current source units operably coupled to said charge node, each of said current source units including:
      a charging segment;
      a discharging segment; and,
      a switching segment coupled to said charging and discharging segments;
   selectively enabling a combination of said current source units;
   driving said switching segment in each enabled one of said current source units responsive to a plurality of reference clock signals for selectively coupling said charging and discharging segments, one exclusive of the other, to said charge node;
   uniquely defining an output waveform at said charge node in response to a plurality of enabled combinations of said current source units; and,
   passing said output waveform through said output conditioning unit to generate at an output node a recovered clock signal based on said output waveform.

28. The phase interpolation method as recited in claim 27, further comprising feeding said recovered clock signal back to a duty cycle correction unit coupled between said output node and a bias node coupled to a variable current source in said charging segment of each enabled one of said current source units, executing said duty cycle correction unit to adaptively bias a current generated through said variable current source responsive to said recovered clock signal, said duty cycle correction unit being tuned according to a preset tuning voltage reference.

29. The phase interpolation method as recited in claim 27, wherein said charging and discharging segments selectively coupled to said charge node alternatively charge and discharge said capacitive integration unit therethrough, said reference clock signals for said enabled current source unit being offset in phase one from the other by a predetermined angle.

30. A phase interpolation method for recovering a phase shifted clock signal based upon a reference clock comprising:
   establishing a capacitive integration unit coupled to a charge node;
   establishing an output conditioning unit coupled to said charge node;
   establishing in CMOS a plurality of current source units operably coupled to said charge node, each of said current source units including:
      a charging segment;
      a discharging segment; and,
      a switching segment coupled to said charging and discharging segments;
   selectively enabling a combination of said current source units;
   driving said switching segment in each enabled one of said current source units responsive to a plurality of reference clock signals for selectively coupling said charging and discharging segments to said charger node;
   uniquely defining an output waveform at said charge node in response to a plurality of enabled combinations of said current source units; and,
   passing said output waveform through said output conditioning unit to generate at an output node a recovered clock signal based on said output waveform, wherein said output conditioning unit executes a comparator function relative to a predetermined reference.

* * * * *